United States Patent
Brezoczky et al.

(10) Patent No.: US 10,998,209 B2
(45) Date of Patent: May 4, 2021

(54) SUBSTRATE PROCESSING PLATFORMS INCLUDING MULTIPLE PROCESSING CHAMBERS

(71) Applicant: APPLIED MATERIALS, INC., Santa Clara, CA (US)

(72) Inventors: Thomas Brezoczky, Los Gatos, CA (US); Kirankumar Neelasandra Savandaiah, Bangalore (IN); Srinivasa Rao Yedla, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/427,642

(22) Filed: May 31, 2019

(65) Prior Publication Data

US 2020/0381275 A1 Dec. 3, 2020

(51) Int. Cl.
*H01L 21/67* (2006.01)
*B65G 29/00* (2006.01)
*H01L 21/687* (2006.01)

(52) U.S. Cl.
CPC ........ *H01L 21/67167* (2013.01); *B65G 29/00* (2013.01); *H01L 21/6719* (2013.01); *H01L 21/67207* (2013.01); *H01L 21/68707* (2013.01); *H01L 21/68764* (2013.01); *H01L 21/67196* (2013.01); *H01L 21/67201* (2013.01)

(58) Field of Classification Search
CPC ........... H01L 21/67167; H01L 21/6719; H01L 21/67207; H01L 21/68707; H01L 21/68764; B65G 29/00
See application file for complete search history.

(56) References Cited

U.S. PATENT DOCUMENTS 4,990,047 A * 2/1991 Wagner ............. H01L 21/67167
 414/217
5,067,218 A * 11/1991 Williams .......... H01L 21/67167
 29/25.01

(Continued)

FOREIGN PATENT DOCUMENTS

CN 100411095 C 8/2008
CN 102965643 B 2/2016

(Continued)

OTHER PUBLICATIONS

International Search Report and Written Opinion dated Sep. 4, 2020 for Application No. PCT/US2020/033456.

*Primary Examiner* — James Keenan
(74) *Attorney, Agent, or Firm* — Patterson + Sheridan LLP

(57) ABSTRACT

Methods and apparatus for substrate processing are provided herein. The apparatus, for example, can include a plurality of multi environment chambers coupled to a buffer chamber configured to load a substrate therefrom into each of the plurality of multi environment chambers for processing of the substrate using a plurality of processing mini environment chambers coupled to each of the plurality of multi environment chambers, at least one of the plurality of multi environment chambers comprising a robot and at least one of the plurality of multi environment chambers comprising a carousel, wherein each of the robot and the carousel is configured to transfer the substrate to and from each of the processing mini environment chamber of the plurality of processing mini environment chambers.

19 Claims, 9 Drawing Sheets

(56) References Cited

U.S. PATENT DOCUMENTS

| | | | |
|---|---|---|---|
| 5,404,894 A * | | 4/1995 | Shiraiwa ............ H01L 21/67167 118/500 |
| 5,863,170 A | | 1/1999 | Boitnott et al. |
| 5,879,459 A | | 3/1999 | Gadgil et al. |
| 6,110,011 A | | 8/2000 | Somekh et al. |
| 6,162,299 A | | 12/2000 | Raaijmakers |
| 6,440,261 B1 | | 8/2002 | Tepman et al. |
| 6,447,607 B2 | | 9/2002 | Soininen et al. |
| 6,576,062 B2 | | 6/2003 | Matsuse |
| 6,604,853 B2 | | 8/2003 | Chao et al. |
| 6,635,115 B1 | | 10/2003 | Fairbairn et al. |
| 6,852,194 B2 | | 2/2005 | Matsushita et al. |
| 6,962,471 B2 | | 11/2005 | Birkner et al. |
| 7,066,703 B2 | | 6/2006 | Johnson |
| 7,090,741 B2 | | 8/2006 | Narushima et al. |
| D527,751 S | | 9/2006 | Kondoh et al. |
| 7,138,336 B2 | | 11/2006 | Lee et al. |
| 7,169,234 B2 | | 1/2007 | Weeks et al. |
| 7,189,432 B2 | | 3/2007 | Chiang et al. |
| 7,258,768 B2 | | 8/2007 | Yamazaki |
| 7,301,157 B2 | | 11/2007 | Buijsse et al. |
| 7,318,869 B2 | | 1/2008 | Chiang et al. |
| 7,422,406 B2 | | 9/2008 | van der Meulen |
| 7,458,763 B2 | | 12/2008 | van der Meulen |
| 7,537,662 B2 | | 5/2009 | Soininen et al. |
| 7,682,454 B2 * | | 3/2010 | Sneh ................ H01L 21/67161 118/719 |
| 7,694,647 B2 | | 4/2010 | Ishikawa et al. |
| 7,784,164 B2 | | 8/2010 | White et al. |
| 7,799,179 B2 | | 9/2010 | Maass et al. |
| 7,806,983 B2 | | 10/2010 | Chiang et al. |
| 7,833,352 B2 | | 11/2010 | Bondestam et al. |
| 7,905,991 B2 | | 3/2011 | Esselbach et al. |
| 7,959,403 B2 | | 6/2011 | van der Meulen |
| 7,988,399 B2 | | 8/2011 | van der Meulen |
| 8,029,226 B2 | | 10/2011 | van der Meulen |
| 8,033,772 B2 | | 10/2011 | Kurita et al. |
| 8,088,678 B2 | | 1/2012 | Kitano et al. |
| 8,197,177 B2 | | 6/2012 | van der Meulen et al. |
| 8,216,380 B2 | | 7/2012 | White et al. |
| 8,267,632 B2 | | 9/2012 | van der Meulen et al. |
| 8,292,563 B2 | | 10/2012 | Haris |
| 8,313,277 B2 | | 11/2012 | van der Meulen et al. |
| 8,354,656 B2 | | 1/2013 | Beloussov et al. |
| 8,403,613 B2 | | 3/2013 | van der Meulen |
| 8,434,989 B2 | | 5/2013 | van der Meulen |
| 8,439,623 B2 | | 5/2013 | van der Meulen |
| 8,450,210 B1 | | 5/2013 | Patton et al. |
| 8,500,388 B2 | | 8/2013 | van der Meulen et al. |
| 8,523,507 B2 | | 9/2013 | van der Meulen |
| 8,558,299 B2 | | 10/2013 | Cao et al. |
| 8,574,409 B2 | | 11/2013 | Kadlec et al. |
| 8,602,716 B2 | | 12/2013 | van der Meulen et al. |
| 8,672,605 B2 | | 3/2014 | van der Meulen et al. |
| 8,696,298 B2 | | 4/2014 | van der Meulen et al. |
| 8,728,239 B2 | | 5/2014 | Bauer et al. |
| 8,807,905 B2 | | 8/2014 | Meulen |
| 8,812,150 B2 | | 8/2014 | van der Meulen et al. |
| 8,870,513 B2 | | 10/2014 | Voser et al. |
| 8,870,514 B2 | | 10/2014 | van der Meulen et al. |
| 8,895,450 B2 | | 11/2014 | Cao et al. |
| 8,944,738 B2 | | 2/2015 | van der Meulen |
| 8,945,308 B2 | | 2/2015 | Schaller |
| 9,005,539 B2 | | 4/2015 | Halpin et al. |
| 9,085,825 B2 | | 7/2015 | Kim |
| 9,103,030 B2 | | 8/2015 | Kato et al. |
| 9,214,589 B2 | | 12/2015 | Voser et al. |
| 9,252,037 B2 | | 2/2016 | Scholte Von Mast et al. |
| 9,281,222 B2 | | 3/2016 | Weaver et al. |
| 9,336,997 B2 | | 5/2016 | Bera |
| 9,340,874 B2 | | 5/2016 | Halpin et al. |
| 9,347,131 B2 | | 5/2016 | Maass et al. |
| 9,355,824 B2 | | 5/2016 | Kadlec et al. |
| 9,378,994 B2 | | 6/2016 | Weaver et al. |
| 9,396,981 B2 | | 7/2016 | Scholte Von Mast et al. |
| 9,443,749 B2 | | 9/2016 | Wakabayashi et al. |
| 9,478,420 B2 | | 10/2016 | Castaldi et al. |
| 9,490,149 B2 | | 11/2016 | Chandrasekharan et al. |
| 9,551,068 B2 | | 1/2017 | Kumagai et al. |
| 9,583,349 B2 | | 2/2017 | Gandikota et al. |
| 9,587,306 B2 | | 3/2017 | Rohrmann et al. |
| 9,644,261 B2 | | 5/2017 | Ineichart et al. |
| 9,698,009 B2 | | 7/2017 | Sato et al. |
| 9,831,094 B2 | | 11/2017 | Rahtu et al. |
| 9,842,755 B2 | | 12/2017 | Ocker et al. |
| 9,884,726 B2 | | 2/2018 | van der Meulen et al. |
| 9,890,473 B2 | | 2/2018 | Newman |
| 9,929,008 B2 | | 3/2018 | Wamura et al. |
| 9,932,674 B2 | | 4/2018 | Kato et al. |
| 9,947,599 B2 * | | 4/2018 | Suzuki ............... H01L 21/67167 |
| 9,953,843 B2 | | 4/2018 | Shen et al. |
| 9,960,072 B2 | | 5/2018 | Coomer |
| 10,043,693 B1 | | 8/2018 | Kim et al. |
| 10,086,511 B2 * | | 10/2018 | van der Meulen ....................... H01L 21/67757 |
| 10,128,134 B2 * | | 11/2018 | Kondoh ............ H01L 21/68707 |
| 10,138,553 B2 | | 11/2018 | Scholte Von Mast et al. |
| 10,145,014 B2 | | 12/2018 | Nozawa et al. |
| 10,170,347 B2 * | | 1/2019 | Fujino ................. H01L 21/6719 |
| 10,202,682 B2 | | 2/2019 | Rieschl et al. |
| 10,202,687 B2 | | 2/2019 | Miura et al. |
| 10,221,480 B2 | | 3/2019 | Kato et al. |
| 10,256,125 B2 | | 4/2019 | Weaver et al. |
| 10,262,888 B2 | | 4/2019 | Gangakhedkar et al. |
| 10,347,470 B2 | | 7/2019 | Lv et al. |
| 10,347,515 B2 | | 7/2019 | Heinz |
| 10,388,559 B2 | | 8/2019 | Rieschl et al. |
| 10,427,303 B2 | | 10/2019 | Weaver et al. |
| 10,586,720 B2 | | 3/2020 | Weaver et al. |
| 10,596,697 B2 * | | 3/2020 | Dai ....................... H01R 43/20 |
| 2002/0051698 A1 | | 5/2002 | Birkner et al. |
| 2002/0096114 A1 * | | 7/2002 | Carducci ........... H01L 21/67184 118/715 |
| 2002/0170671 A1 | | 11/2002 | Matsushita et al. |
| 2003/0109094 A1 | | 6/2003 | Seidel et al. |
| 2004/0159553 A1 | | 8/2004 | Nogami et al. |
| 2004/0261710 A1 | | 12/2004 | Matsushita et al. |
| 2005/0005850 A1 | | 1/2005 | Yamazaki |
| 2005/0006230 A1 | | 1/2005 | Narushima et al. |
| 2005/0111936 A1 | | 5/2005 | Kim et al. |
| 2005/0115822 A1 | | 6/2005 | Maass et al. |
| 2005/0118009 A1 | | 6/2005 | van der Meulen |
| 2006/0051507 A1 | | 3/2006 | Kurita et al. |
| 2006/0056952 A1 | | 3/2006 | Haris |
| 2006/0101728 A1 | | 5/2006 | White et al. |
| 2006/0137608 A1 | | 6/2006 | Choi et al. |
| 2006/0137609 A1 * | | 6/2006 | Puchacz ............. H01L 21/6719 118/719 |
| 2006/0157340 A1 | | 7/2006 | Kurita et al. |
| 2006/0201074 A1 | | 9/2006 | Kurita et al. |
| 2006/0263177 A1 | | 11/2006 | Meulen |
| 2007/0020890 A1 | | 1/2007 | Thakur et al. |
| 2007/0215036 A1 | | 9/2007 | Park et al. |
| 2007/0281090 A1 | | 12/2007 | Kurita et al. |
| 2008/0014055 A1 | | 1/2008 | van der Meulen |
| 2008/0072821 A1 | | 3/2008 | Dalton et al. |
| 2008/0124194 A1 | | 5/2008 | van der Meulen et al. |
| 2008/0124197 A1 | | 5/2008 | van der Meulen et al. |
| 2008/0138176 A1 | | 6/2008 | Kim et al. |
| 2008/0187417 A1 | | 8/2008 | van der Meulen et al. |
| 2008/0219808 A1 | | 9/2008 | van der Meulen et al. |
| 2008/0219812 A1 | | 9/2008 | van der Meulen et al. |
| 2008/0226429 A1 | | 9/2008 | van der Meulen |
| 2008/0232947 A1 | | 9/2008 | van der Meulen et al. |
| 2009/0087286 A1 | | 4/2009 | Meulen |
| 2009/0173622 A1 | | 7/2009 | Weichart et al. |
| 2009/0180847 A1 | | 7/2009 | Guo et al. |
| 2010/0012036 A1 | | 1/2010 | Silva et al. |
| 2010/0075453 A1 | | 3/2010 | Kurita et al. |
| 2010/0120238 A1 | | 5/2010 | Kitano et al. |
| 2010/0281683 A1 | | 11/2010 | White et al. |
| 2010/0304027 A1 | | 12/2010 | Lee et al. |
| 2010/0327187 A1 | | 12/2010 | Beloussov et al. |
| 2012/0027542 A1 | | 2/2012 | Isomura et al. |

(56) References Cited

U.S. PATENT DOCUMENTS

| | | |
|---|---|---|
| 2012/0031749 A1 | 2/2012 | Dubs et al. |
| 2012/0328797 A1 | 12/2012 | Maass et al. |
| 2013/0302115 A1 | 11/2013 | Wakabayashi et al. |
| 2014/0262035 A1 | 9/2014 | Merry et al. |
| 2014/0349011 A1 | 11/2014 | Weichart |
| 2015/0063957 A1 | 3/2015 | Olgado |
| 2015/0240360 A1 | 8/2015 | Leeser |
| 2016/0108515 A1 | 4/2016 | Elghazzali et al. |
| 2016/0138159 A1 | 5/2016 | Kato et al. |
| 2017/0029947 A1* | 2/2017 | Kawahara .......... H01L 21/67167 |
| 2017/0175247 A1 | 6/2017 | Weichart |
| 2017/0218514 A1 | 8/2017 | Kato et al. |
| 2017/0287752 A1* | 10/2017 | Godet ................ H01L 21/67201 |
| 2018/0142350 A1 | 5/2018 | Fukiage et al. |
| 2018/0155834 A1 | 6/2018 | Srinivasan et al. |
| 2018/0195173 A1 | 7/2018 | Kato et al. |
| 2018/0211864 A1* | 7/2018 | Nordin ................ H01L 21/6719 |
| 2018/0245212 A1 | 8/2018 | Schwyn-Thony et al. |
| 2018/0245218 A1 | 8/2018 | Kato |
| 2018/0261473 A1 | 9/2018 | Weichart et al. |
| 2018/0334745 A1 | 11/2018 | Kato |
| 2019/0006218 A1* | 1/2019 | Toyoda .............. H01L 21/68742 |
| 2019/0013225 A1 | 1/2019 | Taguchi et al. |
| 2019/0096715 A1 | 3/2019 | Lodder et al. |
| 2019/0252160 A1 | 8/2019 | Balon et al. |
| 2019/0252166 A1 | 8/2019 | Felzer et al. |

FOREIGN PATENT DOCUMENTS

| | | |
|---|---|---|
| CN | 105734520 B | 8/2018 |
| CN | 105355581 B | 9/2018 |
| CN | 105200393 B | 10/2018 |
| CN | 111696882 A | 9/2020 |
| DE | 10350517 A1 | 6/2005 |
| DE | 102012103295 A1 | 7/2013 |
| DE | 102013111790 A1 | 4/2015 |
| DE | 102013113052 A1 | 5/2015 |
| EP | 2102889 A2 | 9/2009 |
| JP | 5088284 B2 | 12/2012 |
| JP | 5315898 B2 | 10/2013 |
| JP | 5544697 B2 | 7/2014 |
| JP | 5870568 B2 | 3/2016 |
| JP | 6330623 B2 | 5/2018 |
| JP | 6464765 B2 | 2/2019 |
| JP | 6478847 B2 | 3/2019 |
| JP | 2019036630 A | 3/2019 |
| KR | 101887072 B1 | 8/2018 |
| WO | 0137317 A1 | 5/2001 |
| WO | 2017212077 A2 | 12/2017 |
| WO | 2018197305 A2 | 11/2018 |
| WO | 2019020391 A1 | 1/2019 |
| WO | 2019020393 A1 | 1/2019 |
| WO | 2019096515 A1 | 5/2019 |
| WO | 2019096564 A1 | 5/2019 |
| WO | 2019105671 A1 | 6/2019 |

\* cited by examiner

SUBSTRATE PROCESSING PLATFORMS INCLUDING MULTIPLE PROCESSING CHAMBERS

FIELD

Embodiments of the present disclosure generally relate to methods and apparatuses for processing substrates. More particularly, embodiments of the disclosure relate to substrate processing platforms, which use multiple processing chambers for processing substrates, coupled to each other via a common buffer chamber.

BACKGROUND

Conventional cluster tools (e.g., a substrate processing platform) are configured to perform one or more processes during substrate processing. For example, a cluster tool can include a physical vapor deposition (PVD) configured to perform a PVD process on a substrate, an atomic layer deposition (ALD) chamber configured to perform an ALD process on a substrate, a chemical vapor deposition (CVD) chamber configured to perform a CVD process on a substrate, etc., and/or one or more other processing chambers, e.g., a preclean process chamber. The cluster tool can include a robot or a carousel to move the substrate(s) to/from the various processing chambers and/or to/from a buffer chamber or load lock of the cluster tool. Each of the robot and carousel having pros and cons associated therewith.

While the aforementioned cluster tools are suitable for processing a substrate or multiple substrates, the inventors have found that such cluster tools, can be limited in mechanical throughput, vacuum purity, and/or flexibility, can have a relatively large footprint, and/or are relatively expensive.

Accordingly, described herein are substrate processing platforms, which use multiple processing chambers for processing substrates, coupled to each other via a common buffer chamber.

SUMMARY

Methods and apparatus for substrate processing are provided herein. In some embodiments, an apparatus for substrate processing includes a plurality of multi environment chambers coupled to a buffer chamber configured to load a substrate therefrom into each of the plurality of multi environment chambers for processing of the substrate using a plurality of processing mini environment chambers coupled to each of the plurality of multi environment chambers, at least one of the plurality of multi environment chambers comprising a robot and at least one of the plurality of multi environment chambers comprising a carousel, wherein each of the robot and the carousel is configured to transfer the substrate to and from each of the processing mini environment chamber of the plurality of processing mini environment chambers.

In some embodiments, a system for substrate processing can include a front-end module configured to house a plurality of substrates; an interface module coupled to the front-end module and comprising at least one robot configured to move each substrate of the plurality of substrates from the front-end module to the interface module; and a load lock coupled to the interface module and configured to receive each substrate of the plurality of substrates from the interface module and perform a degas process and a cooldown process on each substrate of the plurality of substrates under a vacuum environment, wherein the load lock is coupled to a buffer chamber for transferring each substrate of the plurality of substrates to the buffer chamber after the degas process and the cooldown process is performed, wherein the buffer chamber maintains the vacuum environment while the plurality of substrates are being transferred to the buffer chamber from the load lock and while the plurality of substrates are being loaded from the buffer chamber into each of a plurality of multi environment chambers, and wherein the plurality of multi environment chambers are coupled to the buffer chamber for loading the plurality substrates therefrom into each of the plurality of multi environment chambers for processing the plurality substrates using a plurality of processing mini environment chambers coupled to each of the plurality of multi environment chambers, at least one of the plurality of multi environment chambers comprising a robot and at least one of the plurality of multi environment chambers comprising a carousel, wherein each of the robot and the carousel is configured to transfer the substrate to and from each of the plurality of multi environment chambers of the plurality of processing mini environment chambers.

In some embodiments, a method for processing a plurality of substrates can include loading a first substrate of a plurality of substrates from a buffer chamber into a first processing mini environment coupled to a first multi environment chamber using a robot of the buffer chamber; loading a second substrate of the plurality of substrates into a first processing mini environment coupled to a second multi environment chamber using the robot of the buffer chamber; processing the first substrate using the first processing mini environment coupled to the first multi environment chamber; and processing the second substrate using the first processing mini environment coupled to the second multi environment chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
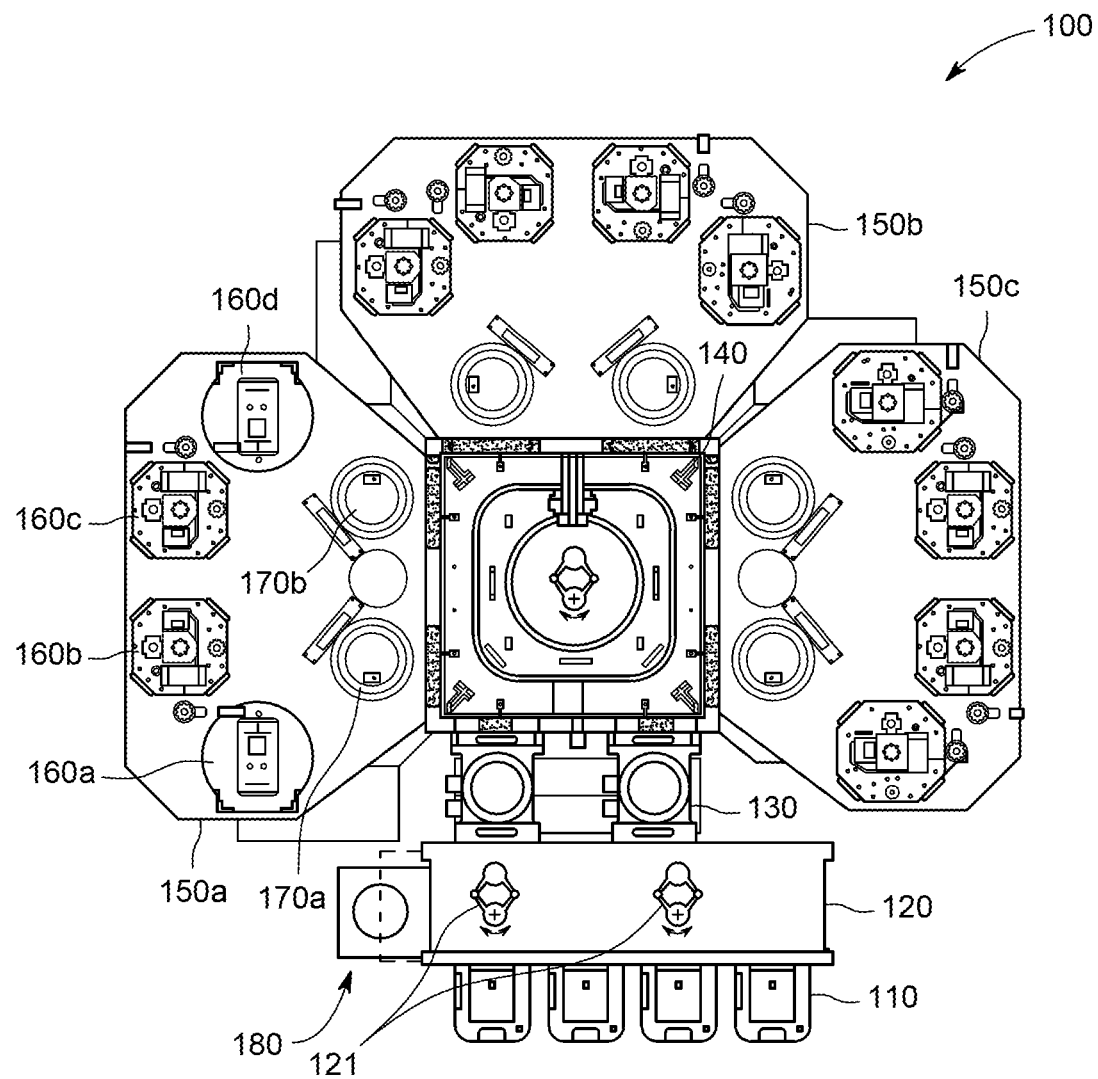
FIG. 1 is a top plan view of a system for processing a substrate in accordance with at least some embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of apparatus and systems for substrate processing are provided herein. Particularly, substrate processing platforms/apparatus that utilize multiple chambers for processing a substrate, such as, for example, PVD processes including fast processes, slow processes, multiple process sequences, degas processes, etc. are described herein. More particularly, the substrate processing platforms/apparatus described herein can use, for example, three independent processing areas containing up to six process positions each connected in parallel with a common buffer chamber to perform substrate processing including, but not limited to, PVD processes, CVD processes, ALD processes, etch processes, and/or degas processes. Moreover, the substrate processing platforms/apparatus described herein are relatively inexpensive, have a relatively small footprint, and have increased mechanical throughput when compared to conventional cluster tools.

FIG. 1 is a top plan view of a system 100 in accordance with at least some embodiments of the disclosure. The system 100 includes a front-end module 110, an interface module 120, and a pair of load locks 130 (hereinafter referred to as the load locks 130). The system also includes a buffer (or vacuum transfer) chamber 140 and a plurality (e.g., three) of multi environment chambers 150a-150c (hereinafter referred to as the pods 150) including a plurality of processing mini environment chambers 160a-160d (hereinafter the chambers 160), and/or enclosed areas 170a and 170b (hereinafter the enclosed areas 170). One or more other chambers and/or modules can also be used in the system 100, as will described in greater detail below.

The front-end module 110 controls the overall operation of the system 100. For example, the front-end module 110 can include one or more controllers/processors (not explicitly shown) that are in operable communication (e.g., wired and/or wireless) via electrical circuitry with the interface module 120, the load lock 130, the buffer chamber 140, and the pods 150 including the chambers 160 and the enclosed areas 170 to process one or more substrates (not explicitly shown) that can be loaded into and housed within the front-end module 110. The front-end module 110 can be configured to receive a user input that can include information (e.g., a recipe) for processing the one or more substrates. The information can include, for example, parameters (e.g., pressure, temperature, power, time, substrate support height relative to a target, process type(s), whether a degas process, pre-clean, etc. needs to be performed, etc.) that are required for processing the one or more substrates. The parameters can vary based on the processing that needs to be performed on the one or more substrates. The front-end module 110 under the control of the controller can use one or more control algorithms (e.g., instructions) stored in memory (e.g., a non-transitory computer readable storage medium) of the front-end module 110 to perform a method for performing the one or more processes on the one or more substrates.

The interface module 120 is coupled to the front-end module 110 and includes one or more robots 121 (shown schematically) that can be configured to move, transfer, load, etc. each of the one or more substrates from the front-end module 110 into the load lock 130.

In some embodiments, an optional etch apparatus 180 can be coupled to the interface module 120, such as one similar to the Centris® line of etch apparatus available from Applied Materials, Inc.

The load lock 130 is configured to receive each of the one or more substrates from the robot of the interface module 120 and perform one or more processes on the one or more substrates. For example, the load lock 130 can be configured to perform a degas process and/or a cooldown process on each of the one or more substrates under a vacuum environment. Alternatively or additionally, the degas process and/or the cooldown process can be performed using the enclosed areas 170, as described in greater detail below. After the degas process and/or the cooldown process have been performed on the one or more substrates within the load lock 130, the one or more substrates are transferred from the load lock 130 to the buffer chamber 140, under a vacuum environment, which, in turn, can transfer the one or more substrates to the pods 150, as will be described in greater detail below.

Figure 2A:
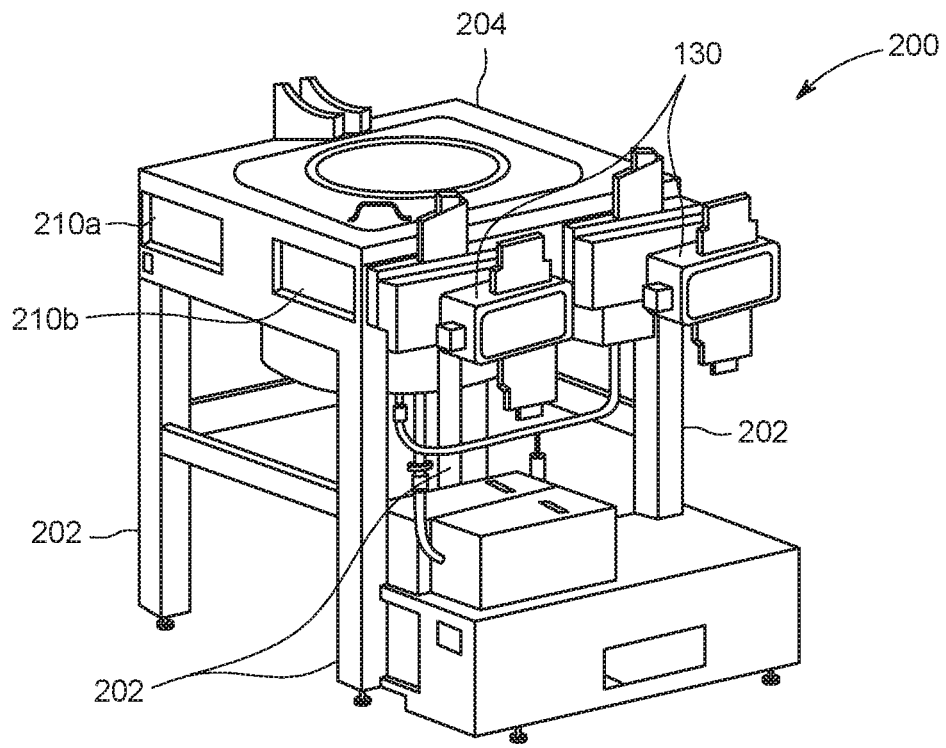
FIG. 2A is a perspective view of a buffer chamber in accordance with at least some embodiments of the disclosure.
Figure 2B:
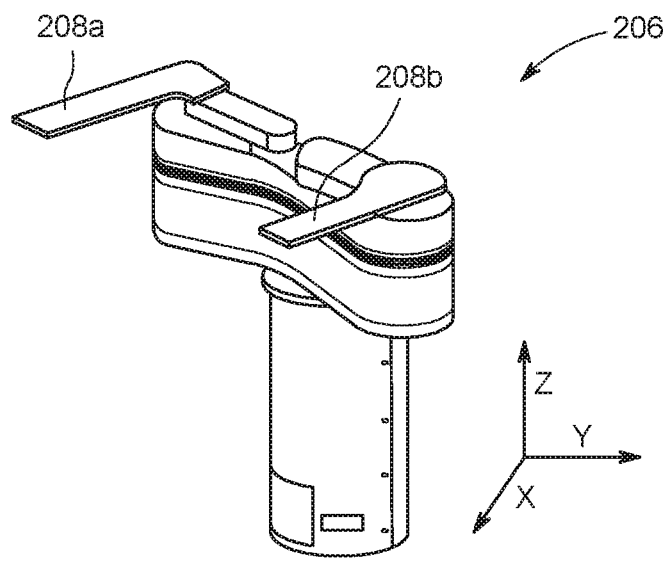
FIG. 2B is perspective view of a robot configured for use with the buffer chamber of FIG. 2A.

FIG. 2A is a perspective view of a buffer chamber 200 and FIG. 2B is a perspective view of a robot 206 configured for use with the buffer chamber 200 of FIG. 2A, in accordance with at least some embodiments of the disclosure. The buffer chamber 200, which is identical to the buffer chamber 140, and the robot 206 can be configured for use with the system 100 of FIG. 1. For illustrative purposes, the buffer chamber 200 is shown coupled to the load locks 130, but without the pods 150 coupled thereto, and the load lock 130 is shown without the interface module 120 coupled thereto.

The buffer chamber 200 includes at least 2 legs 202 (four legs 202 are shown in the drawings) that are configured to support a base 204, an interior volume of which can be maintained at a vacuum environment, that houses one or more robots 206 that can be configured to transfer the one or more substrates from the load lock 130 to the buffer chamber 200, and from the buffer chamber 200 to the pods 150. More particularly, the robot 206 is configured to move along a three-dimensional axis (e.g., the x, y, and z axes) within the base 204 (e.g., under the vacuum environment) and includes one or more substrate handling features (e.g., blades, arms, etc.) that are configured to manipulate (e.g., pick up) the one or more substrates from the load lock 130 and move or transfer the one or more substrates from the load lock 130 and into the buffer chamber 200, while maintaining a vacuum environment. For illustrative purposes, the robot 206 is shown including two substrate handling features 208a, 208b. The robot 206, however, can have more or less than the two substrate handling features 208a, 208b. For example, to increase throughput, the robot 206 can include four or more handling features.

The robot 206 transfers the one or more substrates through one or more vacuum isolating apertures 210a and 210b (aperture 210a and 210b The apertures 210a and 210b are provided on the sides of the base 204 (e.g., where the pods 150 are disposed) and are configured to provide ingress/egress to/from the interior of the base 204 where the robot 206 is housed. For example, in the illustrated embodiment, the apertures 210a and 210b are provided on the three sides of the base 204. Alternatively or additionally, the apertures 210a and 210b can be provided on only one or two sides of the base 204 and can be disposed adjacent or opposite to each other and/or the side of the base 204 that the load locks 130 are disposed. Moreover, while two apertures 210a and 210b are shown in the figures, one aperture of suitable configuration be provided instead of two apertures.

Figure 3A:
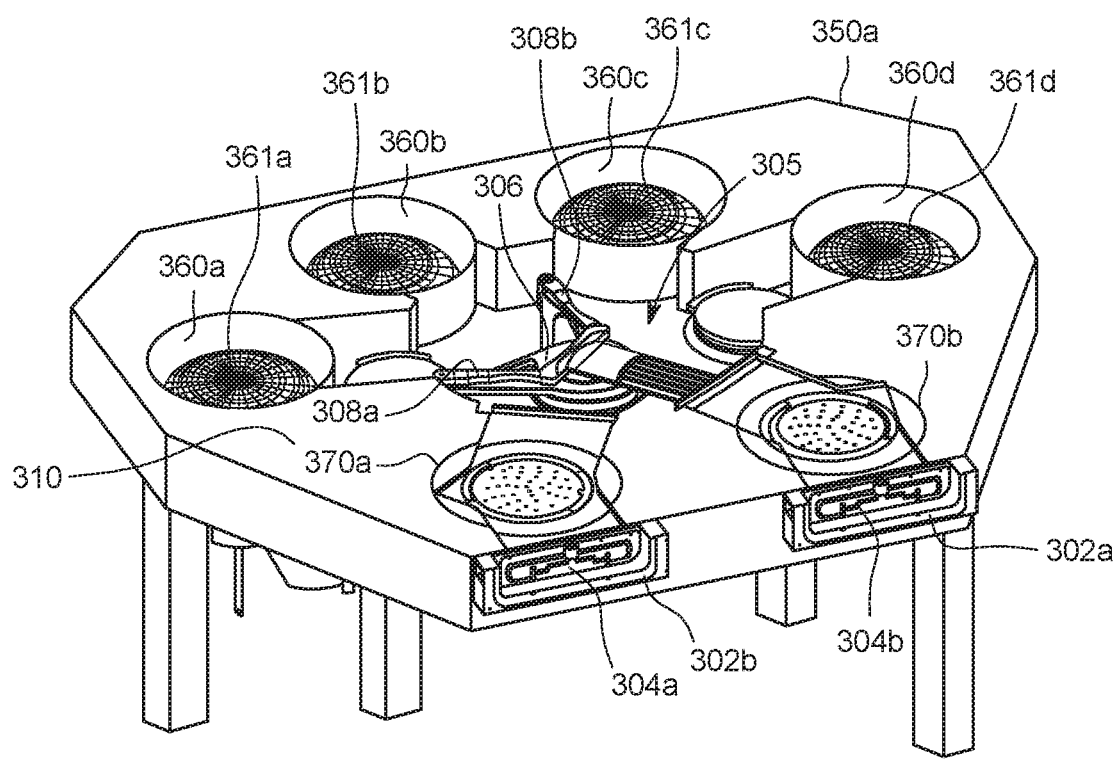
FIG. 3A is a perspective, cut-away view of a multi environment chamber on which a plurality of processing mini environment chambers can be located in accordance with at least some embodiments of the disclosure.

FIG. 3A is a perspective, cut-away view of a pod 350a on which a plurality of chambers 360a-360d and enclosed areas 370a and 370b can be located, in accordance with at least some embodiments of the disclosure. The pod 350a, the chambers 360a-360d, and enclosed areas 370a and 370b correspond to the pod 150a, the chambers 160a-160d, and the enclosed areas 170a and 170b of FIG. 1. Only some of the internal components of the chambers 360a-360d and the enclosed areas 370a and 370b, however, are shown in FIG. 3A.

The pod 350a can be used with the system 100 of FIG. 1 and is coupled to the buffer chamber 200. In the embodiment illustrated in FIG. 3A (and in FIG. 1), the pod 350a includes a generally octagonal configuration, but the disclosure is not so limited, and the pod 350a can have other geometric configurations including, but not limited to hexagonal, pentagonal, etc.

When the pod 350a is coupled to the buffer chamber 200, loading ports 302a and 302b of the pod 350a align with the corresponding apertures 210a and 210b of the buffer chamber 200. The loading ports 302a and 302b can each include a corresponding door 304a and 304b that are controlled by the controller of the front-end module 110. For example, the controller of the front-end module 110 can open and close the doors 304a and 304b when the robot 206 of the buffer chamber 200 is loading or transferring the one or more substrates into and from the pod 305a. The doors 304a and 304b are configured to maintain (or isolate) the vacuum environment within an interior volume 305 of the pod 350a when a robot 306 of the pod 350a is loading or transferring the one or more substrates into and from the chambers 360a-360d and/or the enclosed areas 370a and 370b.

Depending on the configuration of the pod 350a, one or more substrate transfer planes (e.g., provided using shelves) can be provided on the pod 350a. For example, when the pod 350a includes the enclosed area 370a and the enclosed area 370b—which are configured to perform a degas process (and/or a holding cooldown process) on the one or more substrates—prior to the one or more substrates being processed using the chambers 360a-360d, disposed behind each of the loading ports 302a, 302b can be a first or upper shelf have 310 and a second or lower shelf 312 (see FIG. 3B, for example). The first shelf 310 includes a degas area 311 that is configured to support the one or more substrates while a degas process is being performed on the one or more substrates. Similarly, the second shelf 312 includes a cooldown area 313 that is configured to receive and support the one or more substrates after the degas or other process has been performed on the one or more substrates so that a cooldown process can be performed on the one or more substrates while the degas or other process(es) are being performed on the one or more substrates. After the cooldown process is performed on the one or more substrates, the robot 306 can transfer the one or more substrates to the chambers 360a-360d.

Figure 3B:
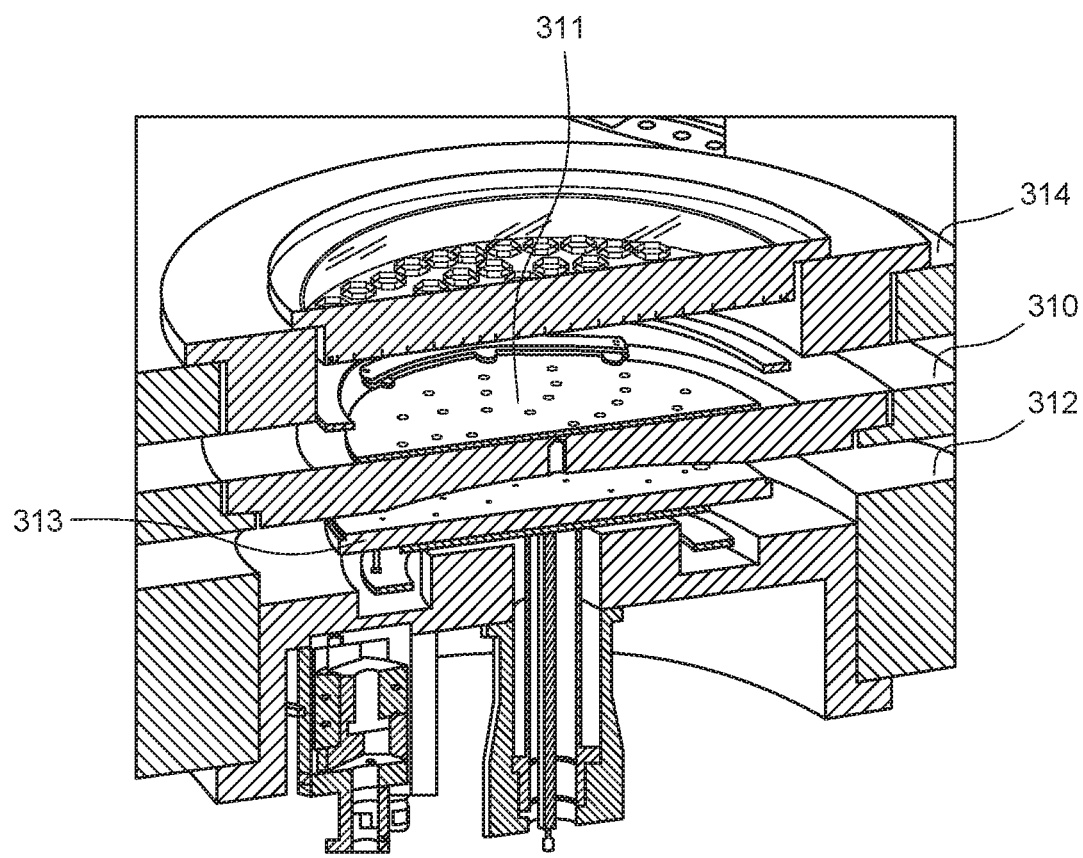
FIG. 3B is a perspective, cut-away view of a portion of the multi environment chamber of FIG. 3A in accordance with at least some embodiments of the disclosure.

The first shelf 310 and the second shelf are spaced-apart from each other at a distance that allows the robot 306 to move the one or more substrates to and from the first shelf 310 and to and from the second shelf 312, and from the first shelf 310 and/or the second shelf 312 to the chambers 360a-360d. Disposed below the second shelf 312 can be one or more components (e.g., gas supply lines, motor assemblies, etc.) that are configured to facilitate performing the degas and/or cooldown processes and disposed above the first shelf 310 is a top surface 314 that is configured to support the chambers 360a-360d (FIG. 3B). The degas area 311 is an isolated process environment (e.g., similar to the mini environment of the chambers 360a-360d) and is configured so that degas effluent is captured and maintained within the degas area 311. Likewise, the cooldown area 313 is an isolated process environment and is configured such that high pressure can be utilized for increased gas conduction to cool the one or more substrates.

With reference again to FIG. 3A, the chambers 360a-360d of the pod 350a can be PVD processing chambers configured to perform a PVD process, chemical vapor deposition (CVD) processing chambers configured to perform a CVD process, atomic layer deposition (ALD) processing chambers configured to perform an ALD process, anneal processing chambers configured to perform an anneal process, pre-clean processing chambers configured to perform a pre-clean process, etc. that are configured to perform a respective one of the processes associated with the chambers 360a-360d. For example, in FIG. 3A, the pod 350a can include two PVD chambers and two pre-clean chambers. More particularly, the chamber 360a and the chamber 360d can be preclean chambers configured to perform a preclean process on the one or more substrates and the chamber 360b and the chamber 360c can be PVD chambers configured to perform PVD on the one or more substrates. Other chamber configurations, however, can also be used depending on, for example, the type of processes that need to be performed on the one or more substrates. For example, as illustrated in FIG. 1, the chambers 150b and 150c can each include four PVD chambers and two enclosed areas. The chamber 360a and the chamber 360d can be the SICONI® preclean chamber and the chamber 360b and the chamber 360c can be the Endura line of PVD® chambers, which are both available from Applied Materials, Inc. Additionally, when the chambers 360a-360d are configured for CVD and/or ALD, the chambers 360a-360d can be the PRODUCER® APF line and the OLYMPIA® line of CVD and ALD chambers, which are also available from Applied Materials, Inc.

In embodiments where the pod 350a is not configured for performing the degas and/or the cooldown processes, the first shelf 310 and the second shelf 312 can be omitted. In such embodiments, for example, the enclosed area 370a and 370b can be replaced with two more PVD chambers, or one or more of the other above-referenced chambers, e.g., CVD chambers, ALD chambers, preclean chambers, and/or anneal chambers. The selected configuration can depend on, for example, a manufacturers preference, user preference, etc.

Likewise, one or more of the chambers 360a-360d can be replaced with one or more corresponding ones of the enclosed area 370a and the enclosed area 370b, again, depending on, for example, a manufacturers preference, user preference, etc.

Continuing with reference to FIG. 3A, the robot 306 can be any suitable robotic device including the robot 206 that is used in the buffer chamber 200. The robot 306, for example, can include two arms 308a and 308b that are hingedly coupled to a central portion of the robot 306 and are configured to move within the interior volume 305 along the x, y, and z axes for transferring the one or more substrates to and from the chambers 360a-360d and to and from the enclosed areas 370a and 370b.

For example, based on an inputted recipe and under the control of the controller of the front-end module 110, after the one or more substrates have been loaded into the loading port 302a (and/or the loading port 302b), the robot 306 can transfer the one or more substrates onto the degas area 311 of the enclosed area 370a so that the degas process can be performed on the one or more substrates.

Next, the robot 306 can transfer the one or more substrates from the degas area 311 of the enclosed area 370a to one or more of the chambers 360a-360d. For example, the robot 306 can transfer the one or more substrates from the degas area 311 of the enclosed area 370a to a substrate support 361a of the chamber 360a so that a preclean process can be performed on the one or more substrates. The substrate support 361a (and the other substrate supports described herein) can be configured to support the one or more substrates and can be moveable in the vertical direction (z axis) for positioning the one or more substrates within the chamber 360a (e.g., based on the corresponding inputted recipe). Next, the robot 306 can transfer the one or more substrates from the chamber 360a to a substrate support 361b of the chamber 360b so that a PVD process can be performed on the one or more substrates. Next, and if provided in the inputted recipe, after the PVD process has been performed on the one or more substrates, the robot 306 can transfer the one or more substrates from the chamber 360b to a substrate support 361c of the chamber 360c so that another PVD process can be performed on the one or more substrates.

Unlike conventional multiprocessing tools, e.g., cluster tools, that include one or more processing chambers that are coupled or hung off the multiprocessing tools, the chambers 360a-360d are completely contained within the pod 350.

Next, the robot 306 can transfer the one or more substrates from the chamber 360c to the cooldown area 313 of the enclosed area 370a so that the cooldown process can be performed on the one or more substrates, and then the robot 206 of the buffer chamber 200 can transfer the processed one or more substrates from the cooldown area 313 to the load locks 130 so that the robot of the interface module 120 can transfer the one or more substrates from the load locks 130 to the front-end module 110 for unloading.

Similarly, a method 600 for processing one or more substrates is described herein. For example, using the pod 350a if an inputted recipe provides that two substrates are to be processed at the same time (or at substantially the same time), at 602 and 604 a first substrate and a second substrate of the one or more substrates can be loaded onto respective ones of the degas areas 311 of the first shelf 310 of the enclosed area 370a and enclosed area 370b. Next, at 606 and 608 the degas process can be performed on the first substrate and the second substrate, respectively as described above. Alternatively, the first substrate can be processed using the pod 350a and the second substrate can be processed—while the first substrate is being processed using the pod 350a—using, for example, another pod 350a or a different type of pod that is coupled to the buffer chamber 200, as will be described in greater detail below.

After the degas processes has been performed on both the first substrate and the second substrate, the robot 306 can sequentially transfer the first substrate and the second substrate to the substrate supports 361a and 361d of the chamber 360a and the chamber 360d, respectively, so that at a preclean process can be performed on the first substrate and the second substrate. Next, the robot 306 can transfer the first substrate and the second substrate to the substrate supports 361b and 361c of the chamber 360b and the chamber 360c, respectively, so that a first respective PVD process can be performed on the first substrate and the second substrate.

In at least some embodiments, thereafter, the robot 306 can transfer the first substrate from the chamber 360b to the chamber 360c, and vice versa for the second substrate. In such embodiments, for example, the robot 306 can first transfer the first substrate to, for example, the degas area 311 of the first shelf 310 of the enclosed area 370a (e.g., for temporary holding of the first substrate), then transfer the second substrate from the chamber 360c to the chamber 360b, and then transfer the first substrate from the degas area 311 of the first shelf 310 of the enclosed area 370a to the chamber 360c so that a second PVD process can be performed on the first substrate and the second substrate. Next, the robot 306 can transfer the first substrate to the cooldown area 313 of the enclosed area 370a and can transfer the second substrate to the cooldown area 313 of the enclosed area 370b so that cooldown processes can be performed on the first substrate and the second substrate, respectively.

The above processes or parts of the processes can be repeated as many times as the recipe requires, e.g. two, three, four, $n^{th}$ times.

Subsequently, the robot 306 can transfer the processed first substrate and the second substrate back to the front-end module 110 in a manner as described above.

The processing methodology of the one or more substrates is controlled by the controller of the front-end module 110, based on, for example, a recipe inputted by a user. Thus, in accordance with the present disclosure, for a given recipe up to six substrates can be processed at the same time (or at substantially the same time) on the pod 350a, and for a given recipe up to eighteen substrates can be processed at the same time (or at substantially the same time) on three pods, e.g., six on each of the pods.

Figure 4A:
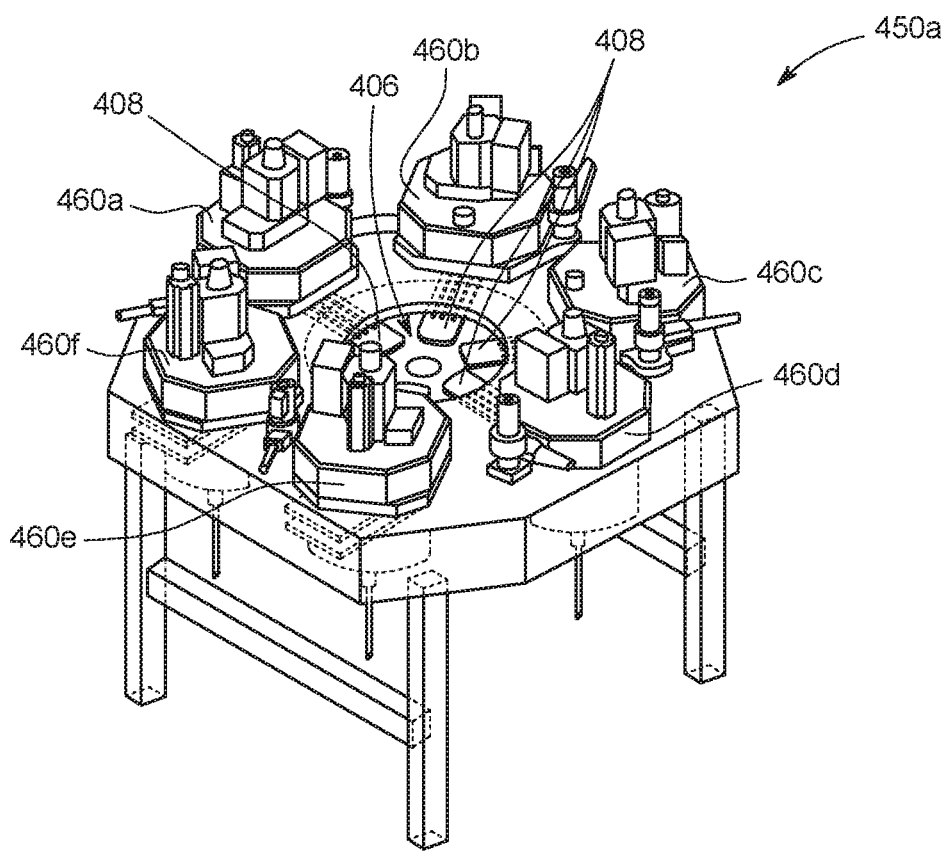
FIG. 4A is a perspective view of a multi environment chamber including a plurality of processing mini environment chambers in accordance with at least some embodiments of the disclosure.

FIG. 4A is a perspective view of a multi environment chamber (e.g., a pod 450a) including a plurality of processing mini environment chambers (e.g., the chambers 460a-460f).

The pod 450a is configured for use with the system 100 of FIG. 1 and is substantially similar to the pod 350a. Accordingly, only those features that are unique to the pod 450a are described herein.

Unlike the pod 350a, the pod 450a uses a configurable carousel 406 instead of a robot 306. The carousel 406 is configured to move, load, and/or transfer the one or more substrates to/from the chambers 460a-460f. The foregoing process or parts of the processes can be repeated as many times as a recipe requires. The carousel 406, however, is configured to move along only one axis (or plane) of rotation, e.g., the x axis and is not configured to manipulate a substrate similarly to the robot 306 discussed above. Accordingly, unlike the pod 350a, the pod 450a does not include one or more enclosed areas (e.g., the enclosed area 370a and/or the enclosed area 370b). In place thereof, as noted above, are two additional chambers, e.g., the chamber 460e and the chamber 460f, which can be configured to perform one or more of the above-referenced processes. In addition, the chambers 460e and 460f are configured to receive the one or more substrates from the robot 206 (e.g., a handoff of the one or more substrates) of the buffer chamber 200, as will be described in greater detail below.

With reference to FIGS. 4C-4F, the carousel 406 includes a hub portion 405 and a plurality of arms 408. The hub portion 405 includes a generally circular configuration and includes a plurality of proximal fixation areas 405a that are configured to respectively couple to proximal ends 401 of the arms 408, using one or more coupling devices, screws, bolts, nuts, etc. For example, in some embodiments, one or more spaced-apart apertures 404 defined through each of the fixation areas 405a and corresponding apertures 410 defined through each of the proximal ends 401 of the arms 408 can be aligned with each other and corresponding nuts and bolts can be used to couple the arms 408 to the hub portion 405. The hub portion 405 is relatively lightweight and can be made from any suitable material including, but not limited to, metal, metal alloy, ceramic, etc.

The arms 408 are identical to each other and include the proximal end 401 and an open (or substantially open, e.g., c-shaped or loop-shaped) distal end 403 (FIG. 4E) that releasably supports an electrostatic chuck (chuck 407) that is configured to support a substrate 409 (FIG. 4F) of the one or more substrates, e.g., instead of the arms 308a and 308b of the robot 306.

Figure 4B:
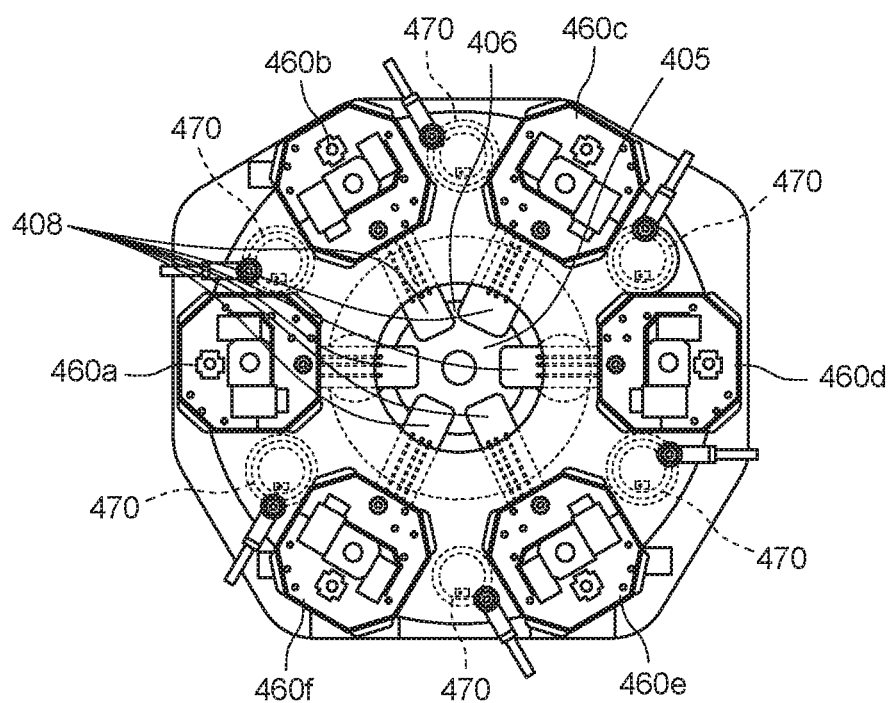
FIG. 4B is a top plan view of the multi environment chamber including the plurality of processing mini environment chambers of FIG. 4A in accordance with at least some embodiments of the disclosure.
Figure 4C:
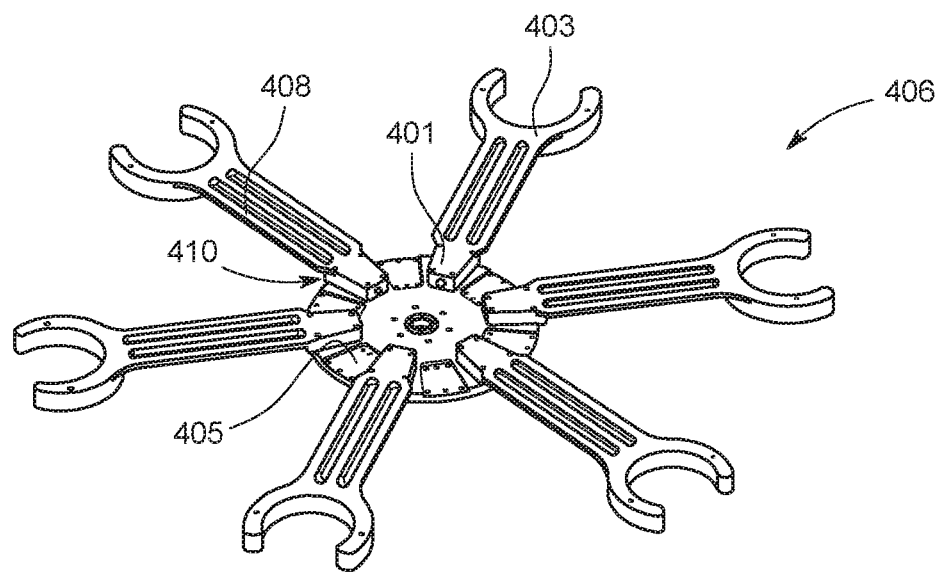
FIG. 4C is a perspective view of a carousel of the multi environment chamber of FIGS. 4A and 4B in accordance with at least some embodiments of the disclosure.
Figure 4D:
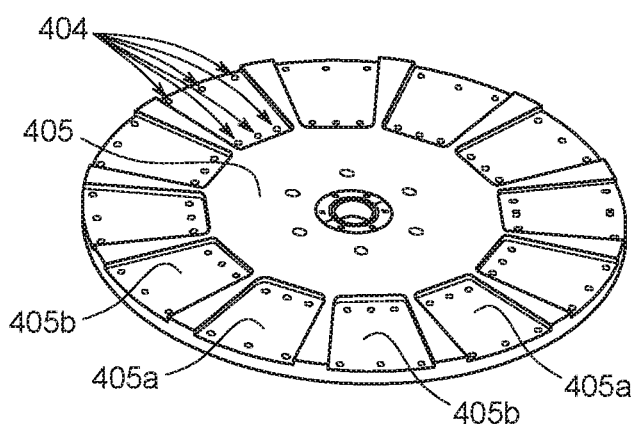
FIG. 4D is a perspective view of a hub portion of the carousel in accordance with at least some embodiments of the disclosure.
Figure 4E:
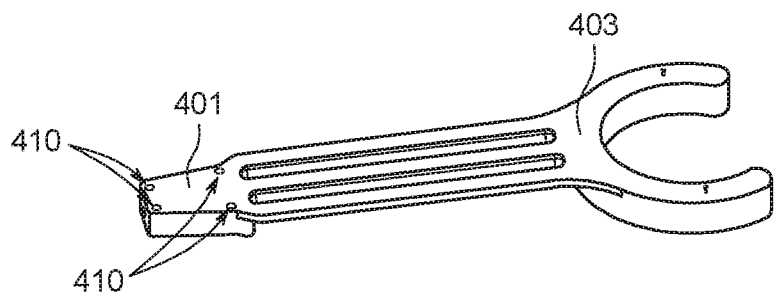
FIG. 4E is a perspective view of an arm of the carrousel in accordance with at least some embodiments of the disclosure.
Figure 4F:
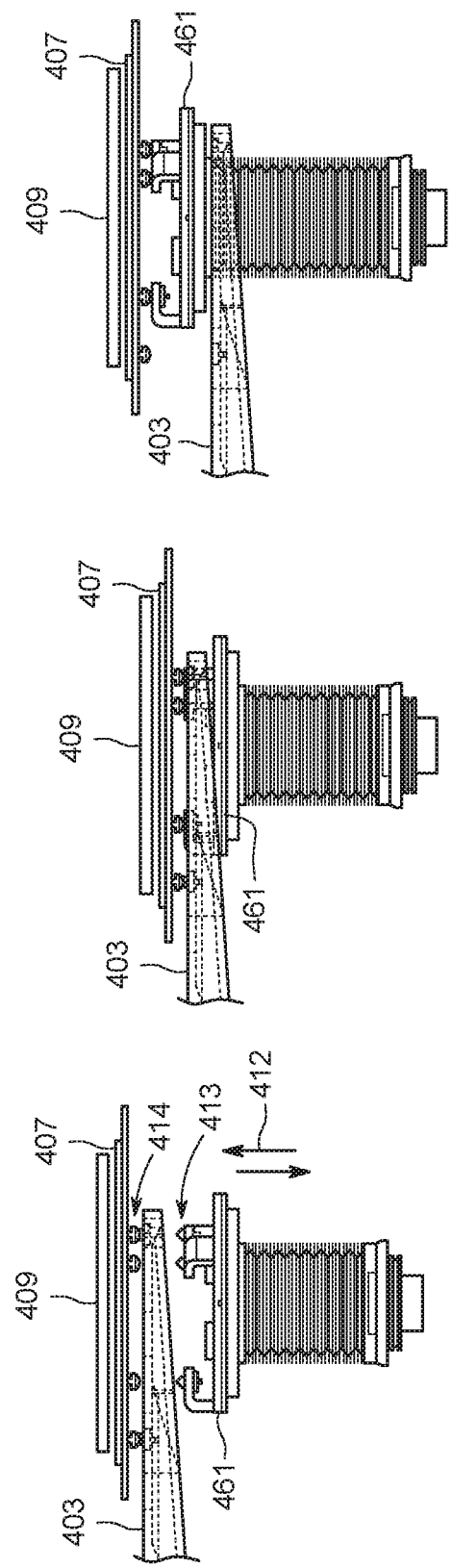
FIG. 4F is a diagram of an arm of a carousel of the multi environment chamber of FIG. 4B in accordance with at least some embodiments of the disclosure.

The substrate 409 and the chuck 407 are configured such that when the carousel 406 moves a corresponding arm 408 into position within one of the chambers 460a-460f, the chuck 407 including the substrate 409 can be loaded together (e.g., as one unit) onto a corresponding substrate support 461, which is similar to the substrate supports 361a-361d of the chambers 350a-350d of the chambers 460a-460f. Particularly, the substrate support 461, which is movable in a vertical direction, e.g., along the x, y, and z axes, for positioning the substrate 409 within the chambers 460a-460f, is configured to engage a bottom surface of the chuck 407 through the opening at the distal end 403 of the arm 408 (FIG. 4F). More particularly, the substrate support 461 includes a plurality of projections 413 each having a relatively pointed tip configuration that are configured to engage an indented configuration on a corresponding plurality of projections 414 that are disposed on a bottom surface of the chuck 407 (FIG. 4F). Continued movement of the substrate support 461 in the vertical direction disengages the chuck 407 including the substrate 409 from the distal end 403 of the arm 408 (FIG. 4F). Once the chuck 407 including the substrate 409 is fully disengaged and disconnected from the distal end 403 and moved to a desired position within one of the chambers 460a-460f, a corresponding process associated with one of the chambers 460a-460f can be performed on the substrate 409. During processing of the substrate 409 within a corresponding one of the chambers 460a-460f, the distal end 403 of the corresponding arm 408 remains inside a corresponding one of the chambers 460a-460f.

In some embodiments, the proximal end 401 of the arm 408 is configured to disengage from the hub portion 405 of the carousel 406 so that the carousel 406 can move freely within the interior of the pod 450a with the remaining arms 408 (e.g., for manipulating one or more other substrates), while a disengaged arm 408 remains positioned within a corresponding one of the chambers 460a-460f.

For example, in at least some embodiments, instead of fixedly coupling the proximal end 401 of the arm 408 to a corresponding one of the fixation areas 405a as described above, one or more magnetic configurations can be used to couple the proximal end 401 to the hub portion 405 of the arm 408 and the chuck 407 to the distal end 403 of the arm 408. More particularly, the magnetic configuration can include an electromagnetic configuration that can be controlled by, for example, the controller (or another type of controller) which can be configured to control a magnetic field provided by the magnetic configuration for allowing the proximal end 401 to releasably couple and uncouple from to the hub portion 405 and the chuck 407 to releasably couple and uncouple from the distal end 403 of the arm 408. More particularly, as a substrate support in a corresponding one of the chambers 460a-460f moves the chuck 407 and the substrate 409 from the distal end 403 of the arm 408, the substrate support also engages a distal end 403 of the arm and raises the arm 408 which disengages the proximal end 401 from the fixation area 405a of the hub portion 405. Once the arm 408 is disengaged from the hub portion 405, the carousel 406 can rotate within the pod 450a and deliver other substrates to and from the other chambers 406a-460f of the pod 450a.

In at least some embodiments, a magnetic configuration can be used to secure/maintain the chuck 407 on the distal end 403 of the arm 408. For example, an electromagnet configuration controlled by the controller can be used for securing the chuck 407 to the distal end 403 of the arm 408.

More specifically, features on both the arm 408 and the pedestal are matched in at least two points, e.g., three, that create a plane, a location, and orientation that can be reliability replicated at each transfer. For example, a feature can include a pointed pin or surface such as a ball that has a radius coupled to a conical cavity. If three points are configured in a radial pattern, the feature is insensitive to changes in size such as due to thermal expansion of the pedestal.

In at least some embodiments, the system 100 of FIG. 1 can include, for example, one or more of the pods 350a and one or more of the pods 450a. The selection of pods 350a and pods 450a can depend on a manufacturer's preference and/or a user's preference.

Figure 6:
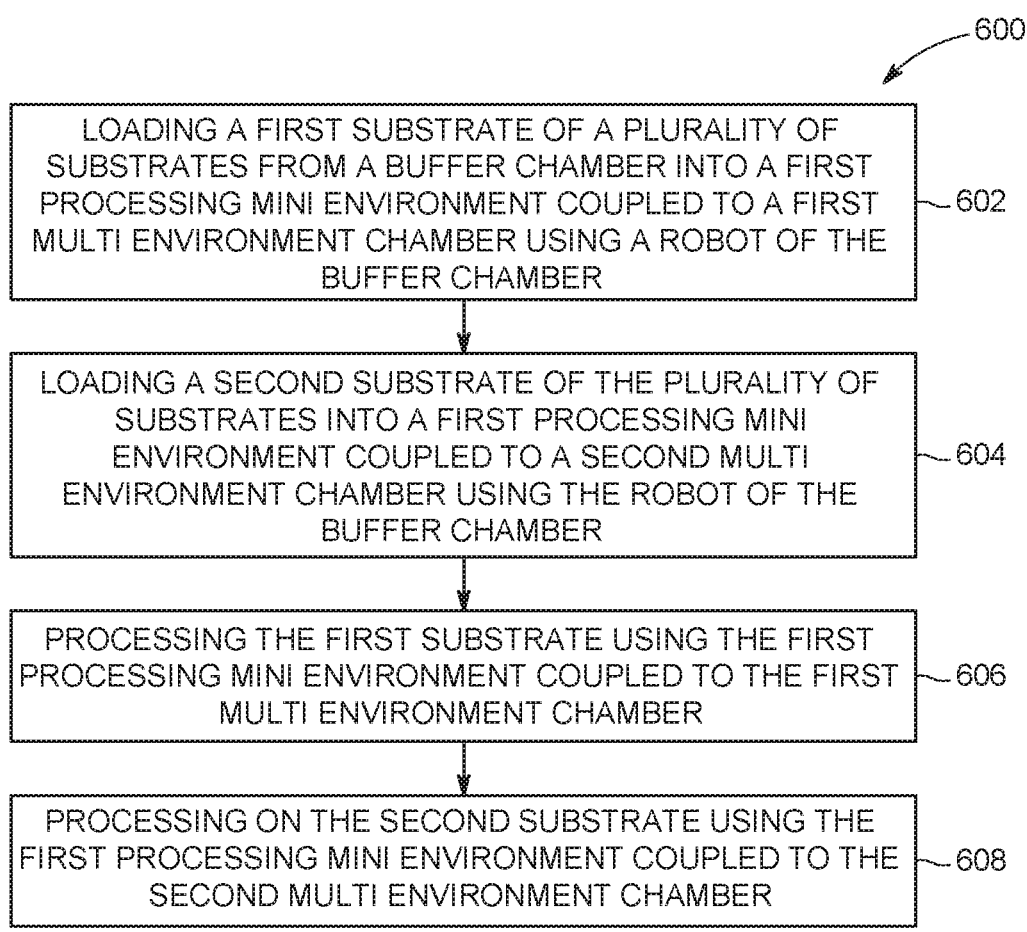
FIG. 6 is a flow-chart of a method for processing a substrate in accordance with at least some embodiments of the disclosure.

For example, with reference again to FIG. 6, while the first substrate is being processed using the pod 350a, a second substrate (e.g., the substrate 409, which can be identical to or different from the first substrate being processed using the pod 350a) can also be processed using the pod 450a. For example, at 604, e.g., using robot 206 of the buffer chamber 200, the substrate 409 can be loaded onto the substrate support 461 of the chamber 460a of the pod 450a, e.g., while the first substrate is being processed using the pod 350a. More particularly, under the control of the controller, the carousel 406 can position the distal end 403 including the chuck 407 disposed thereon in-line with and above the substrate support of the chamber 460a. Once in position, the robot 206 can load (e.g., handoff) the substrate 409 onto the chuck 407.

Next, at 608, one or more processes can be performed on the substrate 409 using the chamber 460a. For example, a preclean process can be performed on the substrate 409. More particularly, the controller can control, for example, the magnetic field provided by the magnetic configuration. For example, the controller can control the magnetic field so that the chuck 407 including the substrate 409 can be uncoupled from the distal end 403 of the arm 408 upon contact of the substrate support with the bottom surface of the chuck 407, e.g., as the substrate support is being raised in a direction shown by arrow 412 to position the substrate 409 to a desired height within the chamber 460a. The desired height can be provided in the recipe used for processing the substrate 409.

Next, after the substrate 409 has been processed using the chamber 460a, the carousel 406 can transfer the substrate 409 from the chamber 460a to the chamber 460b so that, for example, a PVD process can be performed on the substrate 409. More particularly, to transfer the substrate 409 from the chamber 460a, the substrate support within the chamber 460a can be lowered in a direction shown by arrow 412 so that the chuck 407 including the substrate 409 is positioned on the distal end 403 of the arm 408, and the controller can control the magnetic field of the magnetic configuration to couple (e.g., secure) the chuck 407 including the substrate 409 to the distal end 403 of the arm 408. The carousel 406 can then transfer the substrate 409 to the chamber 460b so that the substrate 409 can processed using the chamber 460b.

In some embodiments, one or more shutter stacks 470 including one or more shutter discs (shown in phantom in FIG. 4B) can be provided within the pod 450a. The shutter discs can be used for preconditioning the chambers 460a-460f either during an initial burn of the chambers 460a-460f or the shutter discs can be used in situ for target or process kit cleaning or for paste of the chamber chambers 460a-460. The paste process is an in situ conditioning process step that uses existing materials (targets or gas) or adds new materials (e.g., gas) to create a blank cover film over all of the process environment surfaces in a chamber in order to reduce defects or other lifetime driven performance effects. The shutter discs are used to protect surfaces that otherwise would normally not be exposed to the process. Each of the shutter stacks 470 can be positioned between each of the chambers 460a-460f and are configured to be positioned on the distal end 403 of the arm 408. Alternatively or additionally, each of the shutter stacks 470 can be disposed in one or more other areas within the pod 450a. The shutter stacks 470 can be positioned on a corresponding one of shutter stack supports (not explicitly shown). The shutter stack supports can be configured to operate similar to the substrate supports and can load and/or unload the shutter discs onto the chuck 407 on the distal end 403 of the arms 408. In some embodiments, the hub portion 405 can include one or more additional arms 408 that are configured specifically for the shutter discs. For example, the hub portion 405 is configured to include up to six additional arms 408. More particularly, the hub portion 405 can include up to twelve arms 408 including six arms 408 that are specifically designated for substrate processing and which can couple to the hub portion 405 via corresponding fixation areas 405a and can include six arms 408 that are specifically designated for shutter disc processing and which can couple to hub portion 405 via corresponding fixation areas 405b (see FIG. 4D, for example).

Likewise, the pod 350a can also include the one or more shutter stacks including one or more shutter discs. The robot 306 can be configured to manipulate and/or use the one or more shutter discs for preconditioning the chambers 360a-460f either during an initial burn of the chambers 360a-360d (or the degas area 311 and/or cooldown area 313) or the shutter discs can be used in situ for target or process kit cleaning of the chambers 360a-360d.

Figure 5:
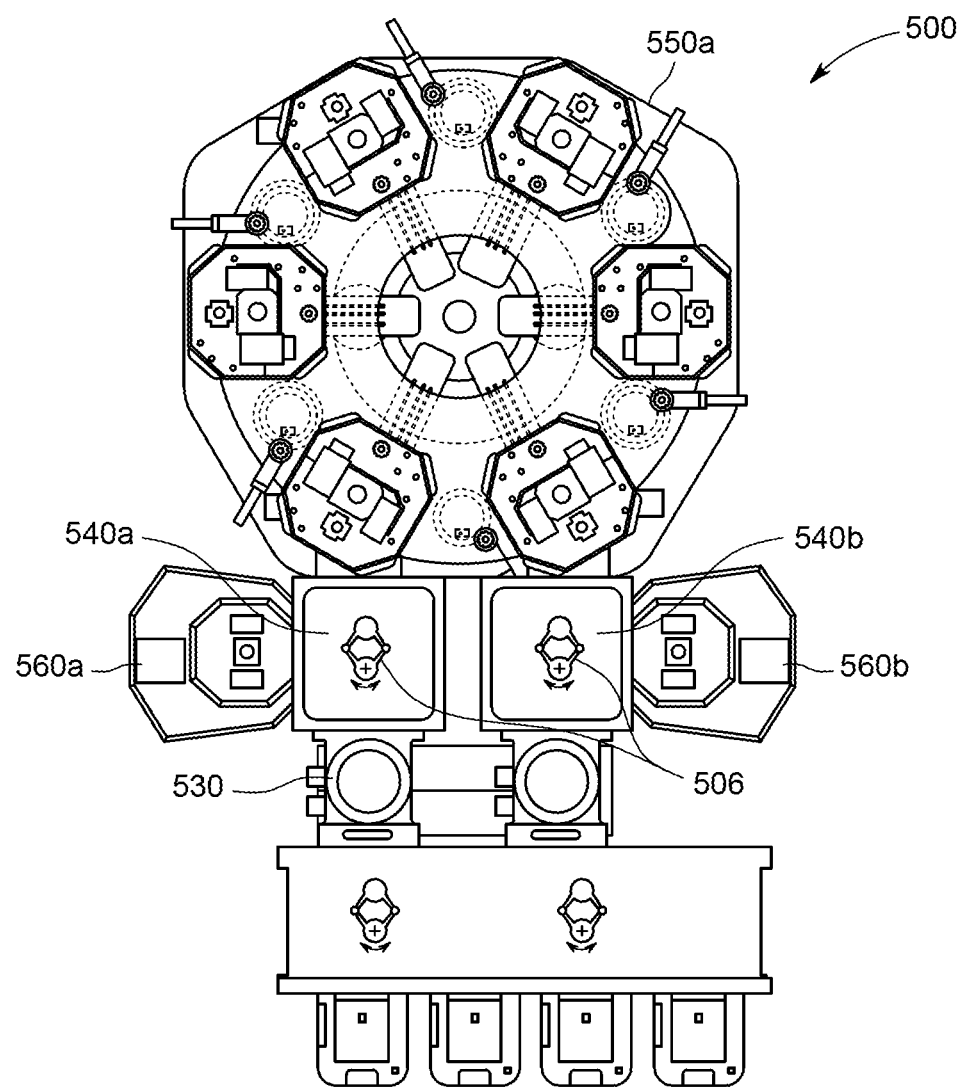
FIG. 5 is a top plan view of a system in accordance with at least some embodiments of the disclosure.

In some embodiments, as illustrated in FIG. 5, for example, a system 500 can include either a pod 350a or a pod 450a. For illustrative purposes, the system 500 is shown including a pod 550a that is configured similar to the pod 450a, e.g., the pod 550a includes a carousel configuration. The system 500 is substantially similar to the system 100. Accordingly, only those features that are unique to the system 500 are herein described.

The system 500 includes a pair of buffer chambers 540a and 540b that are each configured to function in a manner as described above with respect to the buffer chamber 200, and can, therefore be identical to the buffer chamber 200. Accordingly, each of the buffer chambers 540a and 540b can include corresponding robots 506 (shown schematically) that are configured to transfer one or more substrates from load locks 530. Additionally, as the pod 550a includes a carousel configuration, which as noted above is not configured for use with an enclosed area configured to perform a degas and/or cooldown process, one or more chambers 560a and 560b that are configured to perform a degas and/or cooldown process as described above, can be coupled to the buffer chamber 200. The one or more chambers 560a and 560b can also be configured, for example, to perform a preclean process or one or more of the other processes herein described.

While the foregoing is directed to embodiments of the present disclosure, other and further embodiments of the disclosure may be devised without departing from the basic scope thereof.

The invention claimed is:

1. An apparatus for substrate processing, comprising:
a plurality of multi environment chambers coupled to a buffer chamber, wherein each of the plurality of multi environment chambers comprise a plurality of processing mini environment chambers configured for processing a substrate, at least one of the plurality of multi environment chambers comprising a carousel, the carousel comprising:
a plurality of arms coupled to a hub at a proximal end; and
a plurality of chucks, each of the plurality of chucks releasably coupled to a distal end of each of the plurality of arms and configured to support the substrate; and
wherein the carousel is configured to transfer each of the plurality of chucks and the supported substrate between a first of the plurality of processing mini environment chambers to a second of the plurality of processing mini environment chambers.

2. The apparatus of claim 1, wherein each of the plurality of multi environment chambers comprises a hexagonal configuration.

3. The apparatus of claim 1, wherein each of the plurality of processing mini environment chambers within one of the multi environment chambers comprise a physical vapor deposition chamber, and each of the mini environment chambers are disposed within an interior volume of the multi environment chamber.

4. The apparatus of claim 1, wherein the carousel is configured to position each of the substrates together with each of the plurality of chucks over a substrate support disposed within each processing mini environment chamber of the plurality of processing mini environment chambers.

5. The apparatus of claim 1, wherein the buffer chamber further comprises at least one robot including at least two substrate handling features that are configured to load the substrate therefrom into each of the plurality of multi environment chambers.

6. The apparatus of claim 1, further comprising:
a plurality of substrate supports, wherein each of the substrate supports are disposed below one of the plurality of processing mini environment chambers, and each substrate support is configured to disengage a first chuck of the plurality of chucks releasably coupled to the distal end of each of the plurality of arms from a first arm of the plurality of arms when the first arm is disposed over each substrate support of the plurality of substrate supports.

7. The apparatus of claim 6, wherein, a bottom surface of the first chuck is engaged by the one of the plurality of substrate supports when the chuck of the plurality of chucks is disengaged from the distal end of the first arm of the plurality of arms.

8. A method for processing a plurality of substrates, comprising:
loading a first substrate of a plurality of substrates from a buffer chamber into a first multi environment chamber using a robot of the buffer chamber, wherein loading the first substrate comprises:
positioning the first substrate on a first chuck disposed on a first arm of a carousel;
loading a second substrate of the plurality of substrates into the first multi environment chamber using the robot of the buffer chamber, wherein loading the second substrate comprises:
positioning the second substrate on a second chuck disposed on a second arm of the carousel;
processing the first substrate using a first processing mini environment coupled to the first multi environment chamber, wherein processing the first substrate comprises:
engaging a bottom surface of the first chuck with a first substrate support;
lifting the first chuck to a desired position using the first substrate support; and
processing the first substrate in the first processing mini environment while the chuck is in the desired position;
processing the second substrate using the first processing mini environment coupled to the first multi environment chamber, wherein processing the second substrate comprises:
engaging a bottom surface of the second chuck with the first substrate support;
lifting the second chuck to a desired position using the first substrate support; and
processing the second substrate in the first processing mini environment while the chuck is in the desired position.

9. The method of claim 8, wherein processing the first substrate and the second substrate each further comprise performing a physical deposition process (PVD).

10. The method of claim 8, further comprising, prior to processing the first substrate and processing the second substrate:
performing a degas process on the first substrate using a corresponding first enclosed area on the first multi environment chamber; and
performing a degas process on the second substrate using a load lock coupled to the buffer chamber.

11. The method of claim 8, wherein processing the first substrate and processing the second substrate comprises performing a preclean process on the first substrate and the second substrate.

12. The method of claim 11, further comprising, after performing the preclean process on the first substrate and the second substrate:
transferring the first substrate and first chuck from a first processing mini environment position to a second processing mini environment position coupled to the first multi environment chamber using the carousel and performing another process on the first substrate, which is not the preclean process; and
transferring the second substrate and second chuck from the first processing mini environment position to a second processing mini environment position beneath a second multi environment chamber using the carousel and performing another process on the second substrate, which is not the preclean process.

13. The method of claim 8, further comprising, after processing the first substrate while the first chuck is in the desired position:
lowering the first chuck and the first substrate from the desired position;
positioning the first chuck on the first arm and disengaging the first chuck from the first substrate support;
transferring the first substrate and first chuck from a first processing mini environment position of the first multi environment chamber to a second processing mini environment position;
engaging the first chuck with a second substrate support disposed in the second processing mini environment position; and
disengaging the first chuck from the first arm of the carousel.

14. An apparatus for substrate processing, comprising:
a multi environment chamber coupled to a buffer chamber, wherein the multi environment chamber comprises a plurality of processing mini environment chambers configured for processing a substrate, at least one of the plurality of multi environment chambers comprising a carousel, the carousel comprising:
a plurality of arms coupled to a hub at a proximal end; and
a plurality of chucks, each of the plurality of chucks releasably coupled to a distal end of each of the plurality of arms and configured to support the substrate; and
wherein the carousel is configured to transfer each of the chucks and the supported substrate between a first of the plurality of processing mini environment chambers to a second of the plurality of processing mini environment chambers.

15. The apparatus of claim 14, further comprising:
a plurality of substrate supports, wherein each of the substrate supports are disposed below one of the plurality of processing mini environment chambers, and each substrate support is configured to disengage one of the plurality of chucks coupled to the distal end of one of the plurality of arms and lift the chuck to a desired position within one of the processing mini environment chambers.

16. The apparatus of claim 15, wherein a bottom surface of each chuck of the plurality of chucks is engaged by the one of the plurality of substrate supports when each chuck of the plurality of chucks are disengaged from the distal end of one of the plurality of arms.

17. The apparatus of claim 16, wherein each chuck of the plurality of chucks further comprises an indented configuration on a bottom surface and the substrate support further comprises a plurality of projections configured to engage the indented configuration.

18. The apparatus of claim 17, wherein the distal end of one of the plurality of arms further comprises at least two features for coupling one of the plurality of chucks to the distal end.

19. The apparatus of claim 18, wherein the plurality of projections and the at least two features are configured to radially align with the indented configuration on the bottom surface of one chuck of the plurality of chucks.

* * * * *